US007619917B2

(12) United States Patent
Nirschl et al.

(10) Patent No.: US 7,619,917 B2
(45) Date of Patent: Nov. 17, 2009

(54) MEMORY CELL WITH TRIGGER ELEMENT (75) Inventors: Thomas Nirschl, Essex Junction, VT (US); Thomas Happ, Tarrytown, NY (US); Jan Boris Philipp, Peekskill, NY (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/605,079

(22) Filed: Nov. 28, 2006

(65) Prior Publication Data

US 2008/0123398 A1 May 29, 2008

(51) Int. Cl.
*G11C 11/39* (2006.01)
*G11C 11/36* (2006.01)
*G11C 11/00* (2006.01)

(52) U.S. Cl. .................. 365/180; 365/148; 365/163; 365/175

(58) Field of Classification Search .............. 365/163, 365/180
See application file for complete search history.

(56) References Cited

U.S. PATENT DOCUMENTS

| 4,882,706 | A  | * | 11/1989 | Sinclair ............... 365/180 |
| 5,933,365 | A  | * | 8/1999  | Klersy et al. ........... 365/148 |
| 6,141,241 | A  | * | 10/2000 | Ovshinsky et al. ....... 365/163 |
| 6,625,054 | B2 | * | 9/2003  | Lowrey et al. .......... 365/148 |
| 6,754,123 | B2 | * | 6/2004  | Perner et al. .......... 365/209 |
| 6,813,177 | B2 | * | 11/2004 | Lowrey et al. .......... 365/148 |
| 6,873,538 | B2 | * | 3/2005  | Hush ................... 365/148 |
| 6,937,528 | B2 | * | 8/2005  | Hush et al. .......... 365/189.07 |
| 6,954,385 | B2 | * | 10/2005 | Casper et al. ........ 365/189.07 |
| 6,967,865 | B2 | * | 11/2005 | Lee .................... 365/163 |
| 7,042,760 | B2 | * | 5/2006  | Hwang et al. .......... 365/163 |
| 7,085,154 | B2 | * | 8/2006  | Cho et al. ............ 365/163 |
| 7,283,383 | B2 | * | 10/2007 | Kang .................. 365/148 |
| 7,295,462 | B2 | * | 11/2007 | Farnworth ............. 365/158 |
| 2006/0227591 | A1 | | 10/2006 | Lowrey et al. |
| 2006/0233019 | A1 | | 10/2006 | Kostylev et al. |

FOREIGN PATENT DOCUMENTS

EP    1 521 270 A1    4/2005

OTHER PUBLICATIONS

"Ovonic Unified Memory—A High-performance Nonvolatile Memory Technology for Stand Alone Memory and Embedded Applications", Manzur Gill, Tyler Lowrey and John Park, ISSCC, 2002, 4 pgs.

"Highly Reliable 50nm Contact Cell Technology for 256Mb PRAM", S.J. Ahn, Y.N. Hwang, Y.J. Song, S.Y. Lee, J.H. Park, C.W. Jeong, K.C. Ryoo, J.M. Shin, J.H. Park, Y.Fai, J.H. Oh, G.H. Koh, G.T. Jeong, S.H. Joo, S.H. Choi, Y.H. Son, J.C. Shin, Y.T. Kim, H.S. Jeong and Kinam Kim, 2005 Symposium on FLSI Technology Digest of Technical Papers, 2 pgs.

(Continued)

*Primary Examiner*—Son L Mai
(74) *Attorney, Agent, or Firm*—Eschweiler & Associates, LLC (57) ABSTRACT

A memory device includes a plurality of word lines extending as rows and bit lines extending as columns. A memory cell is coupled between a word line and a bit line, wherein the memory cell includes a unipolar memory element selectively coupled to the bit line via a trigger element.

31 Claims, 7 Drawing Sheets

OTHER PUBLICATIONS

"4-Mb MOSFET-Selected Phase-Change Memory Experimental Chip", F. Bedeschi, R. Bez, C. Boffino, E. Bonizzoni, E. Buda, G. Casagrande, L. Costa, M. Ferraro, R. Gastaldi, O. Khouri, F. Ottogalli, F. Pellizzer, A Pirovano, C. Resta, G. Torelli and M. Tosi, IEEE, 2004, pp. 207-210.

"A Fully Symmetrical Sense Amplifier for Non-Volatile Memories", F. Bedeschi, E. Bonizzoni, O. Khouri, C. Resta and G. Torelli, IEEE, ISCAS 2004, pp. 625-628.

"Conductive bridging RAM (CBRAM): An emerging non-volatile memory technology scalable to sub 20 nm", Michael Kund, Gerhard Beitel, Cay-Uwe Pinnow, Thomas Röhr, Jörg Schumann, Ralf Symanczyk, Klaus-Dieter Ufert and Gerhard Müller, IEEE, 2005, 4 pgs.

"Multi-layer Cross-point Binary Oxide Resistive Memory (OxRAm) for Post-NAND Storage Application", G.Baek, D.C. Kim, M.J. Lee, H.-J. Kim, E.K. Yim, M.S. Lee, J.E. Lee, S.E. Ahn, S. Seo, J.H. Lee, J.C. Park, Y.K. Cha, S.O. Park, H.S. Kim, I.K. Yoo, U-In Chung, J.T. Moon and B.I. Ryu, IEEE 2005, 4 pgs.

"Novell Colossal Magnetoresistive Thin Film Nonvolatile Resistance Random Access Memory (RRAM)", W. W. Zhuang, W. Pan, B.D. Ulrich, J.J. Lee, L. Stecker, A. Burmaster, D. R. Evans, S.T. Hasu, M. Tajiri, A. Shimaoka, K. Inoue, T. Naka, N. Awaya, K. Sakiyama, Y. Wang, S.Q. Liu, N.J. Wu and A. Ignatiev, IEEE 2002, 4 pgs.

* cited by examiner

MEMORY CELL WITH TRIGGER ELEMENT

FIELD OF INVENTION

The present invention relates generally to a memory device, and more particularly to a circuit configured to selectively access a memory cell.

BACKGROUND OF THE INVENTION

In the case of conventional memory devices, in particular conventional semiconductor memory devices, it is sometimes common to differentiate between functional memory devices (e.g., PLAs, PALs, etc.) and table memory devices. For example, some table memory devices include ROM devices (Read Only Memory) such as PROMs, EPROMs, EEPROMs, flash memories, etc., and RAM devices (Random Access Memory or read-write memory) such as DRAMs and SRAMs.

In the case of SRAMs (Static Random Access Memory), individual memory cells consist of, for example, six transistors configured as a cross-coupled latch. In the case of DRAMs (Dynamic Random Access Memory), generally only one single, correspondingly controlled capacitive element (e.g., the gate-source capacitance of a MOSFET) is employed, wherein charge may be stored in the capacitance. The charge in a DRAM, however, remains for only a short time, and a periodic refresh must be performed, to maintain a data state. In contrast to the DRAM, the SRAM requires no refresh, and the data stored in the memory cell remains stored as long as an appropriate supply voltage is fed to the SRAM. Both SRAMs and DRAMs are considered volatile memories, wherein a data state is only retained as long as power is supplied thereto.

In contrast to volatile memory, non-volatile memory devices (NVMs), e.g., EPROMs, EEPROMs, and flash memories, exhibit a different property, wherein the stored data is retained even when the supply voltage associated therewith is switched off. This type of memory has several advantages for various types of mobile communications devices such as, for example, in an electronic rolodex on cell phones, wherein the data therein is retained even when the cell phone is turned off.

One type of non-volatile memory is called resistive or resistively switched memory devices. In such a resistive memory, a memory material positioned between two appropriate electrodes (i.e., an anode and a cathode) is placed, by appropriate switching processes, in a more or less conductive state, wherein the more conductive state corresponds to a logic "1", and the less conductive state corresponds to a logic "0" (or vice versa). Suitable resistive memories can be, for example, perovskite memory, as described in W. W. Zhuamg et al., "Novell Colossal Magnetoresistive Thin Film Nonvolatile Resistance Random Access Memory (RRAM)", IEDM 2002, resistive switching in binary oxides (OxRAM), for example, as described in I. G. Baek et. al., "Multi-layer crosspoint binary oxide resistive memory (OxRAM) for post-NAND storage application", IEDM 2005, phase change memory (PCRAM), and conductive bridging RAM (CBRAM), as described in M. Kund et al., "Conductive bridging RAM (CBRAM): An emerging non-volatile memory technology scalable to sub 20 nm", IEEE, 2005.

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to achieve a change in the phase change material from an amorphous state to a crystalline state, an appropriate heating current is applied to the electrodes, wherein the current heats the phase change material beyond the crystallization temperature thereof. This operation is sometimes called a SET operation. Similarly, a change of state from a crystalline state to an amorphous state is achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell.

Figure 1:
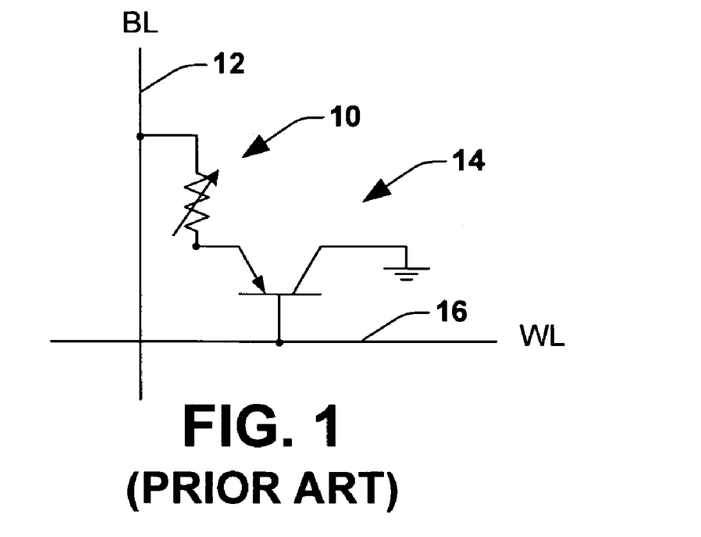
FIG. 1 is a schematic diagram illustrating a conventional memory architecture employing a select transistor for selective access to a memory element associated therewith.

Conventionally, resistive switched memories such as phase change memory devices are organized in one or more arrays of phase change cells in a core area of the device, wherein each phase change memory cell is composed of a phase change memory element coupled to a selection switching device. One conventional arrangement is illustrated in FIG. 1, wherein a phase change element 10 is coupled between a bit line 12 and a bipolar select transistor 14. A word line 16 is coupled to the base terminal of the transistor 14. By properly addressing the bit line 12 and word line 16 associated therewith, data may be written thereto and read therefrom. An array of phase change memory cells configured in the manner described above is sometimes called a NOR type memory array.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment of the invention, a memory device is disclosed, and comprises a plurality of word lines extending as rows and bit lines extending as columns. The memory device further comprises a unipolar memory cell coupled between a respective word line and bit line. The memory cell comprises a memory element selectively electrically coupled to the bit line via a trigger element.

In another embodiment of the invention, a method of accessing a unipolar memory cell is disclosed. The memory cell is selectively coupled to a bit line via a trigger component that is coupled to a word line, and the method comprises raising the bit line to an access voltage, and applying a pulse to the word line having a pulse duration that is less than a duration of an access of the unipolar memory cell.

In another embodiment the duration of the pulse applied to the word line is the same as the read access.

In another embodiment the duration of the pulse applied to the word line is larger than the read access time The following description and annexed drawings set forth in detail certain illustrative aspects and implementations of the invention. These are indicative of only a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout. The invention relates to a memory circuit architecture and associated method of addressing such an architecture.

Figure 2:
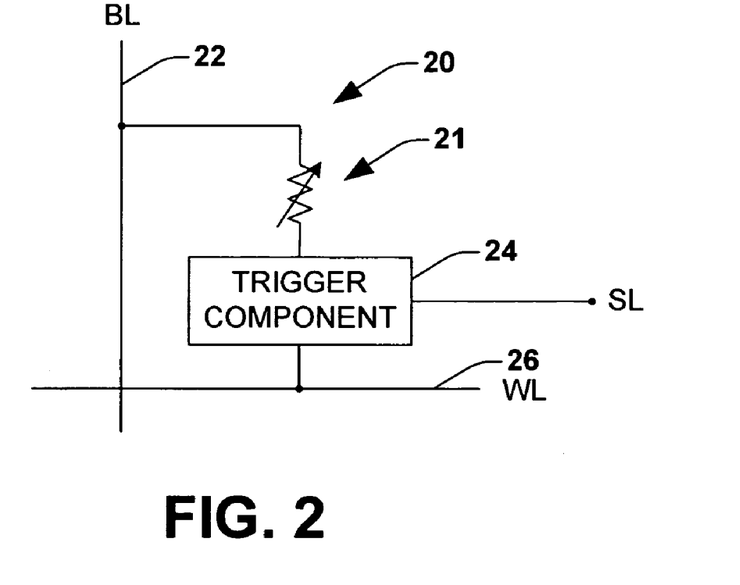
FIG. 2 is a schematic diagram illustrating a memory architecture employing a trigger component for selective access to a memory element associated therewith according to one embodiment of the invention.

FIG. 2 is a schematic diagram illustrating a memory device architecture 20 according to one embodiment of the invention. In the embodiment of FIG. 2, a NOR type memory architecture has a unipolar memory element such as a phase change memory element 21 coupled to a bit line 22, however, any resistive switching type memory element may be employed and is contemplated as falling within the scope of the invention. A trigger component 24 is coupled between the memory element 21 and a word line 26, and is operable to selectively electrically couple the memory element to the bit line 22 by creating a conductive path therethrough to a source line (SL) 28 that is coupled to a predetermined potential such as circuit ground. The trigger component 24 is activated by a pulse applied thereto via the word line 26. The trigger component 24 advantageously does not require the word line 26 to be maintained at a high voltage throughout the access period of the memory cell 21.

Figure 3:
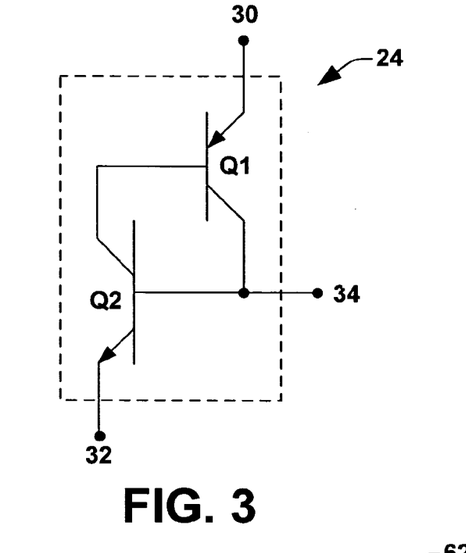
FIGS. 3 and 4 are schematic diagrams illustrating exemplary trigger components according to various embodiments of the invention.

In one embodiment of the invention, the trigger component 24 comprises a thyristor device, as illustrated in FIG. 3. In the embodiment of FIG. 3, the thyristor 24 has an anode 30, a cathode 32 and a gate 34. The thyristor, in one embodiment, can be thought of as a complementary regenerative switch, wherein a first transistor Q1 has a base current derived from a second transistor Q2, and wherein the second transistor has a base current that is derived form the first transistor Q1. The thyristor 24 can operate as a switch, wherein a base current is applied to the gate terminal 34 (via a voltage applied thereto in one embodiment), and Q1 turns on, thereby causing Q2 to turn on. The way the two transistors feed each other is sometimes referred to as regenerative switching or feed forward.

After the thyristor 24 turns on, the device stays conducting even if the gate drive at node 34 is removed. Therefore the thyristor 24 can be activated, or triggered, by only a brief pulse in one embodiment. Consequently, an activation signal at the gate 34 that is coupled to the word line does not have to stay high throughout an entire access time period. The thyristor 24 can be turned off or deactivated by reducing voltage therethrough below a predetermined value, sometimes referred to as the minimum holding voltage. One manner in which the current can be reduced is by shorting out the anode and cathode terminals 30 and 32, such as by bringing the bit line 22 that is operably coupled to the anode 30 via the memory element 21 down to the source line (SL) voltage, which may be circuit ground in one embodiment.

Figure 4:
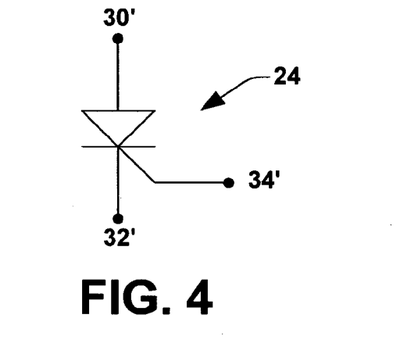

FIG. 4 is another schematic diagram of a trigger component that is often employed to represent a thyristor. It should be understood that although a conventional thyristor is illustrated and explained in one embodiment, the present invention contemplates any type of trigger device or circuit and such alternatives are contemplated as falling within the scope of the present invention.

Figure 5:
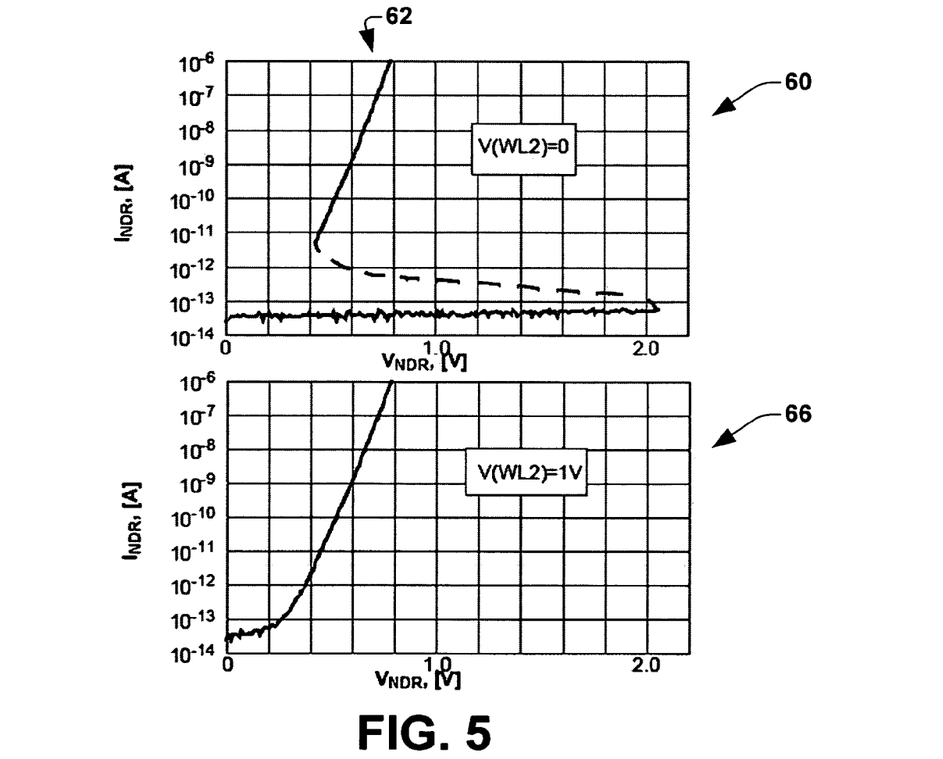
FIG. 5 illustrates two graphs highlighting behavior of a trigger component in various biasing conditions according to an embodiment of the invention.
Figure 6:
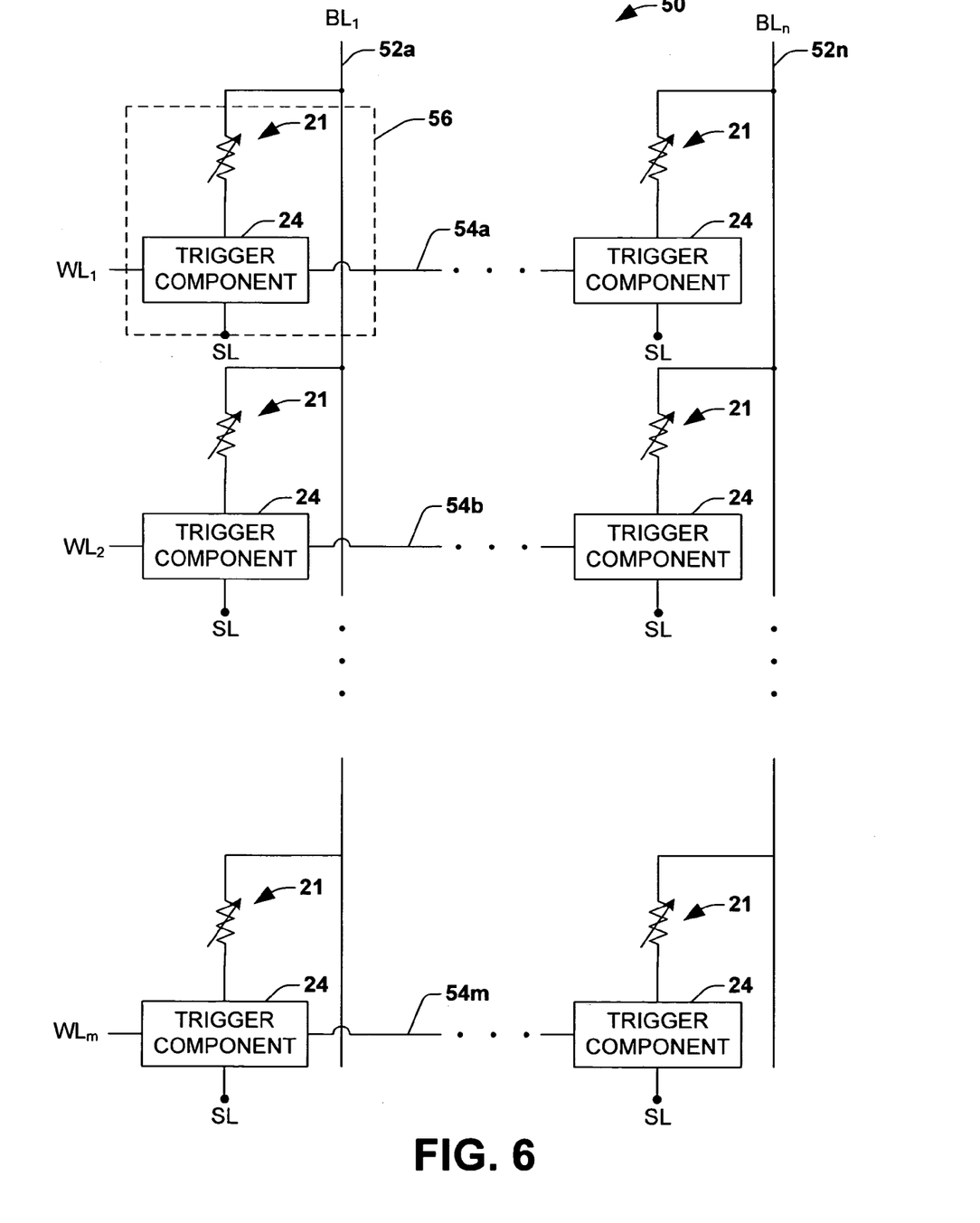
FIG. 6 is a block diagram illustrating a memory device architecture employing trigger components as select devices according to an embodiment of the invention.

FIG. 5 illustrates a graph of a thyristor device in operation in accordance with one exemplary embodiment of the invention, such as the memory device architecture 50 of FIG. 6. The architecture 50 of FIG. 6 is an array portion of a memory arranged in "n" columns and "m" rows comprising bit lines 52a-52n and word lines 54a-54m, respectively. In one embodiment the array portion 50 is configured in a NOR type architecture, wherein each memory unit cell 56 is coupled between a respective bit line 52 and a common source line (SL). Each unit cell 56 comprises a unipolar memory component or element 21 and a trigger component 24. Each trigger component 24 is further coupled to a respective word line 54, and is configured to selectively electrically couple the respective memory element 21 to its respective bit line 52 based on a pulsed status of the respective word line 54.

Referring concurrently to FIGS. 5 and 6, in operation, the trigger component 24 operates in the architecture 50 of FIG. 6 as follows. When a particular word line 54 is low, the top graph 60 of FIG. 5 is informative. For an anode-to-cathode voltage less than about 2V in one embodiment, the trigger component 24 behaves as an open circuit, thereby electrically isolating the respective memory elements 21 associated with the word line from their respective bit lines. This condition can be maintained by holding the bit lines associated with the memory elements at a low voltage value, such as the value at the respective source line (SL). In one embodiment, this value may be 0V. If the bit line voltage rises substantially more than 2V above the respective source line voltage, the trigger component breaks down, as illustrated by the snap back voltage and current conduction at 62 of FIG. 5. Consequently, in one embodiment of the invention, bit line access voltages are maintained at about 2V or less to prevent undesired break-down of the trigger component.

By optimizing one or more process parameters of the trigger element the break-down voltage can be controlled to values other than 2V.

Still referring to FIGS. 5 and 6, when a memory cell is to be accessed, the word line voltage is at least momentarily non-zero, and the respective bit line 52 is raised to an access voltage. As illustrated in graph 66 in FIG. 5, this causes the trigger component 24 to conduct with a forward biased voltage associated therewith that resembles that of a traditional diode in one embodiment. With the trigger component conducting, the associated memory element 21 is electrically coupled to the respective bit line 52, and is available for access thereto, such as a read or write operation. As can be appreciated from the discussion above, the respective word line 54 need only be raised to a sufficient trigger voltage for a brief period of time to cause activation of the trigger component 24, after which the word line may be brought back to a low level and the trigger component 24 continues to conduct.

Further, for other non-selected bit lines, when the non-selected bit lines are held to a low voltage, the pulse on the word line does not cause the respective trigger components to conduct because the trigger components are effectively shorted out. In addition, by not having to hold the respective word line high during the entire access time period, any leakage associated with non-selected bit lines is greatly reduced.

Figure 7:
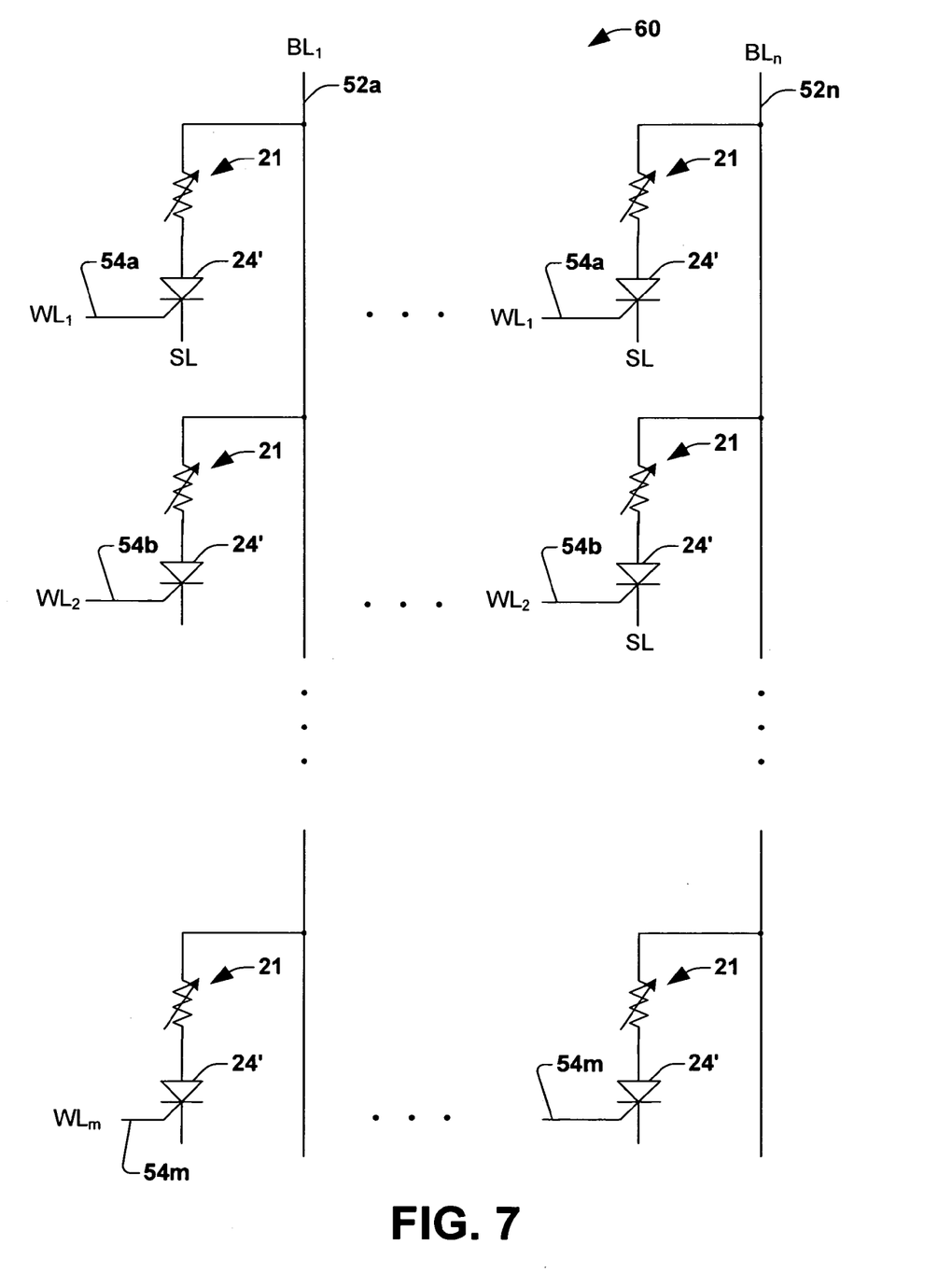
FIG. 7 is a schematic diagram illustrating a memory device architecture employing thyristor devices as trigger components according to an embodiment of the invention.

Turning now to FIG. 7, another architecture 60 is disclosed according to another embodiment of the invention. In FIG. 7, the trigger component 24 is replaced with a particular type of trigger component, namely a thyristor 24', wherein a gate terminal is coupled to a respective word line 54. Further, an anode thereof is coupled to a respective memory element 21, while the cathode thereof is coupled to a common source line (SL). Upon a pulse applied to the word line 54 (when the respective bit line 52 is at an access voltage), the thyristor 24' is activated and conducts for the entire access time period, which ends when the respective bit line is brought low toward the source line voltage. As discussed supra, since the word line need only be raised for a long enough time to trigger the thyristor 24', which is substantially shorter than the entire access time period, leakage associated with non-selected bit lines is decreased substantially.

Figure 8:
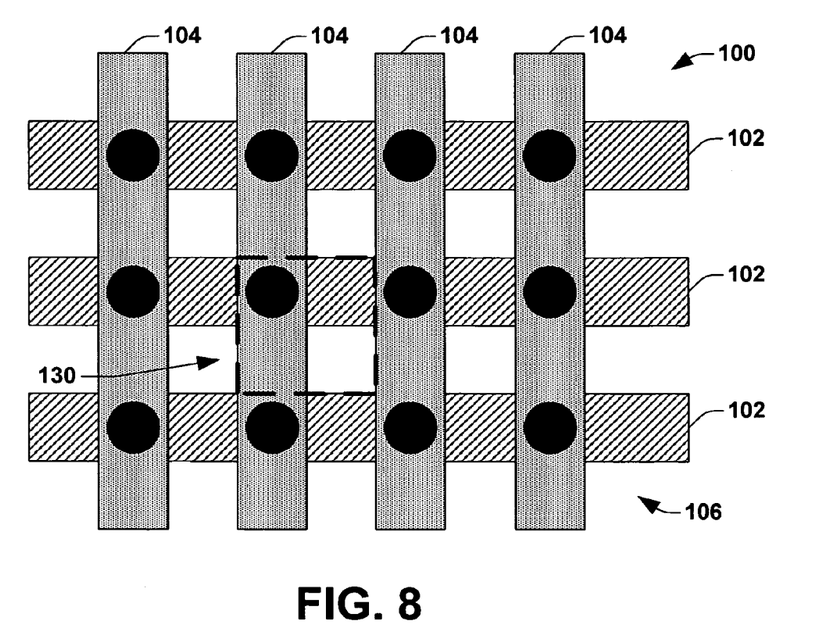
FIG. 8 is a plan view illustrating a fragmentary layout of a portion of a memory array employing a vertical thyristor device as a trigger component, wherein the word line surrounds the vertical thyristor structure according to one embodiment of the invention.
Figure 9:
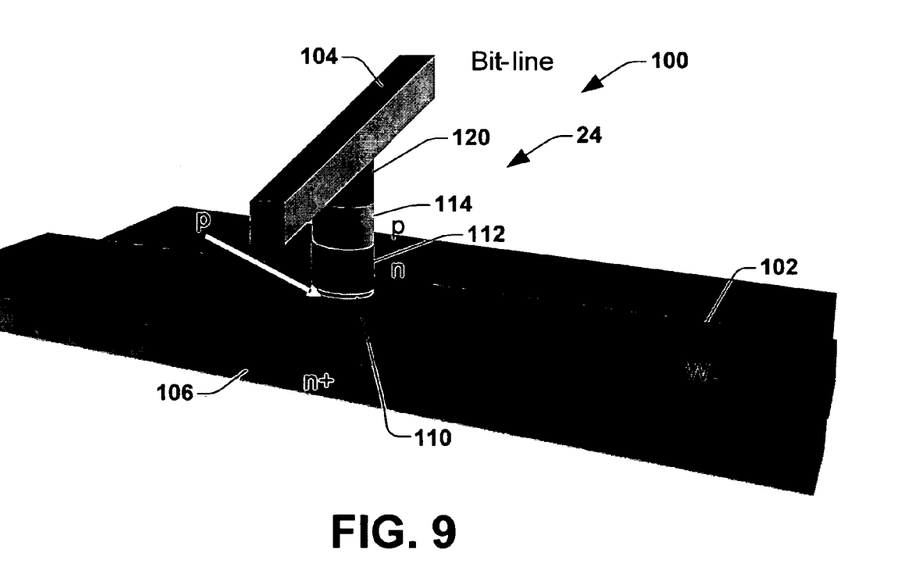
FIG. 9 is a fragmentary perspective view illustrating the vertical thyristor device having a portion surrounded by the word line of FIG. 8, according to an embodiment of the invention.

The architectures 50 and 60 of FIGS. 6 and 7 may be implemented in any layout implementation, and all such variations are contemplated as falling within the scope of the present invention. In one embodiment, a layout may be employed, wherein the trigger component 24 comprises a semiconductor SCR type device with a vertically oriented pnpn configuration structure, as illustrated in FIGS. 8 and 9 at reference numeral 100. In FIG. 8, a fragmentary plan view of a portion of a memory array is provided, wherein word lines 102 extend laterally in rows and bit lines 104 extend vertically thereover in columns. The word lines 102 overlie a semiconductor substrate 106 (an n-type material in one embodiment) with a dielectric layer (not shown) interposed therebetween in one embodiment. Overlying the word lines 102 is a dielectric layer (not shown) through which a vertically extending trench is formed that further extends through a respective word line and underlying dielectric.

A liner oxide (or other dielectric) is then formed within the hole periphery that extends into the word line, followed by a formation of a p-type semiconductor material 110 (in the word line hole) via a selective epitaxial deposition, in one embodiment. Subsequent formation of an n-type material 112 and another p-type material 114 within the trench results in the vertical SCR structure 24. Another thin dielectric is formed thereover (not shown) in one embodiment followed by a formation of the memory material 120 in the trench. The conductive bit line 104 is then formed (deposition and patterning in one embodiment) thereover, making electrical contact to the memory element material 120.

As can be seen in FIG. 8, the layout provides for a compact unit cell 130, wherein an area thereof is driven primarily by the control in which word lines and bit lines can be arranged. The thin dielectric material between the word line 102 and the thyristor 24 provides for a capacitive coupling thereto. Further, a dielectric material between the thyristor 24 and the memory element material 120 also provides for a capacitive coupling therebetween.

Figure 10:
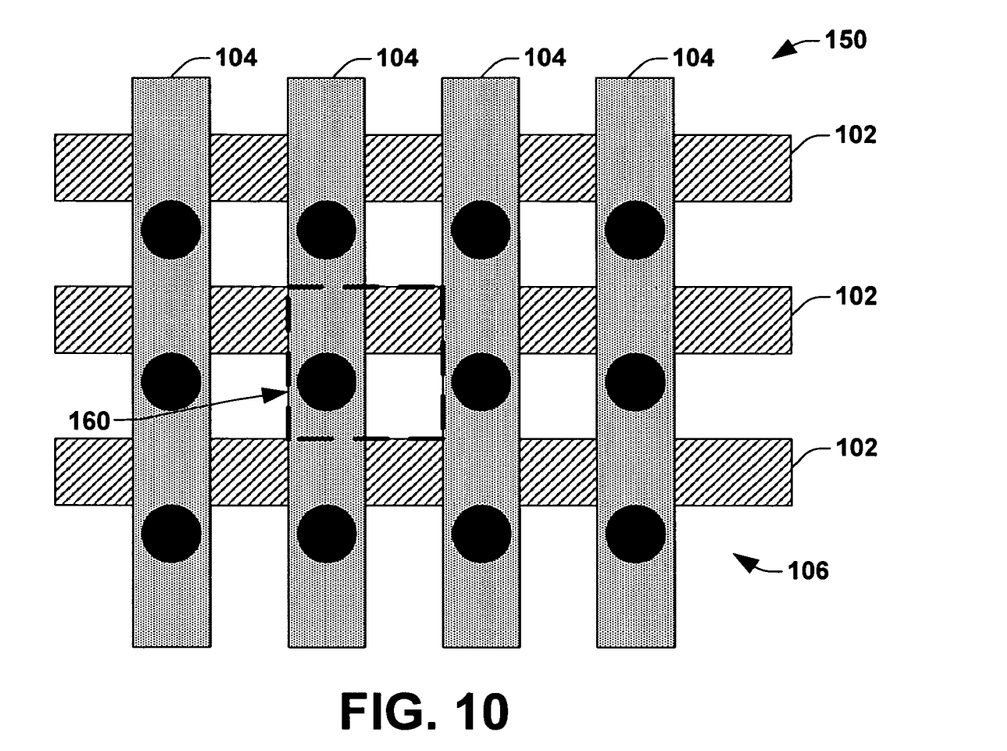
FIG. 10 is a plan view illustrating a fragmentary layout of a portion of a memory array employing a vertical thyristor device as a trigger component, wherein the word line substantially abuts the vertical thyristor structure according to one embodiment of the invention.
Figure 11:
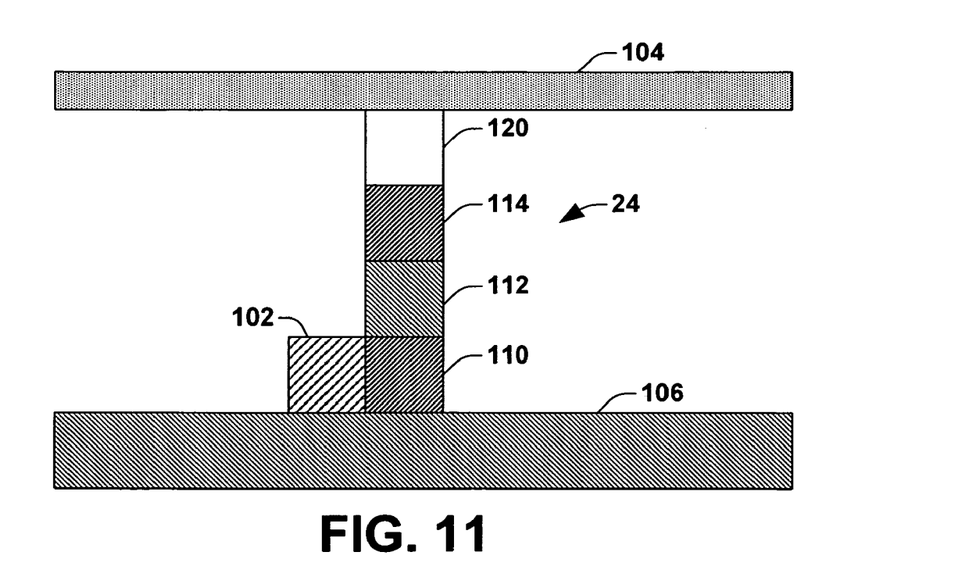
FIG. 11 is a fragmentary side view illustrating the vertical thyristor device having a portion abutted by the word line of FIG. 10, according to an embodiment of the invention.

FIG. 10 is a fragmentary plan layout view of a memory array portion 150 according to another embodiment of the invention. The array portion 150 comprises word lines 102 and bit lines 104. Referring to FIGS. 10 and 11, the thyristor 24 is a vertical structure that electrically couples to an overlying bit line 104 through the memory element 120. In one embodiment, a dielectric material (not shown) is interposed between regions 114 and 120 to provide a capacitive coupling between the memory element 120 and the thyristor 24. In contrast to the layout of FIGS. 8 and 9, the vertical thyristor structure of FIGS. 10 and 11 does not extend through the respective word line 102, but instead laterally abuts the word line structure 102. In one embodiment a dielectric material (not shown) resides between the word line 102 and the region 110 of the thyristor 24 to provide a capacitive coupling thereto.

The resulting unit cell 160 illustrated in FIG. 10 shows the word line 102 running alongside the vertical thyristor/memory element structure. This layout allows the word line 102 to be made as thin as possible without having to account for resistive portions due to thinning at regions where the word line would otherwise wrap around the thyristor.

Figure 12:
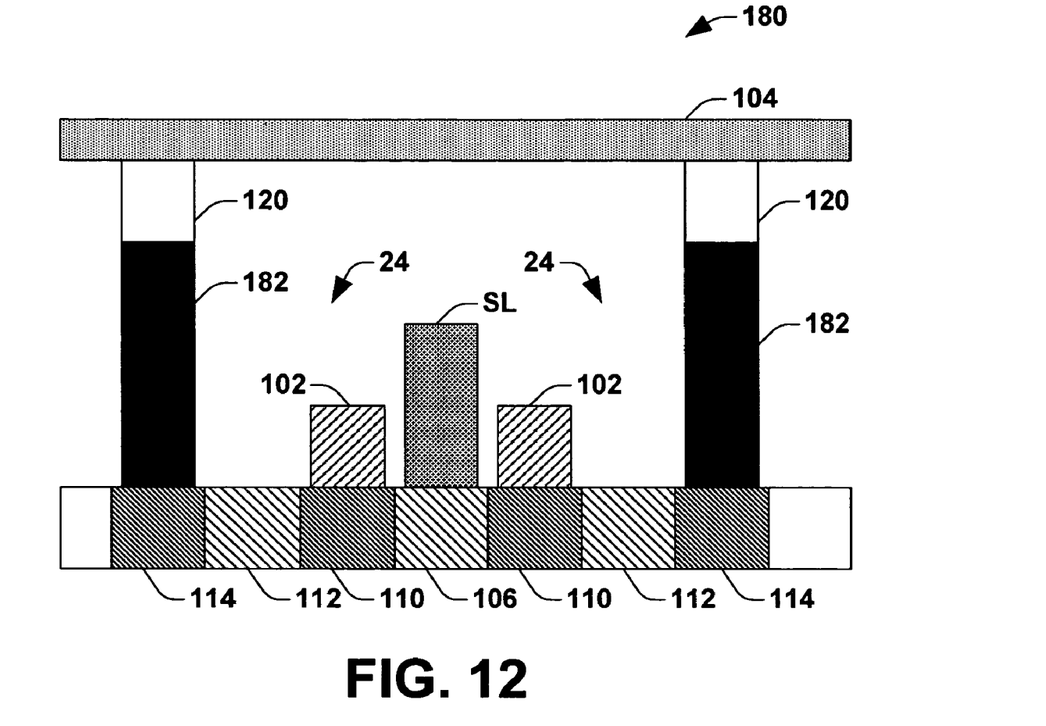
FIG. 12 is a fragmentary side view illustrating a lateral thyristor device formed on or in a semiconductor substrate, wherein a word line overlies a portion of the lateral thyristor device, according to another embodiment of the invention.

In yet another embodiment of the invention, the thyristor device 24 may comprise a lateral structure illustrated in FIG. 12, as opposed to a vertical structure, as illustrated in FIGS. 9 and 11. Each thyristor pair 24 shares a physically common source line (SL) and comprises a portion 106 of the thyristor device. A thyristor 24 is formed in a semiconductor substrate in one embodiment, or is formed on a semiconductor substrate surface in another embodiment. The thyristor 24 is electrically coupled to its respective memory element 120 via a vertically extending conductive contact 182 that extends through a dielectric material (not shown for sake of simplicity). A respective word line 102 is formed over a portion 110 of each thyristor 24. A dielectric material (not shown) is interposed therebetween in one embodiment to provide a capacitive coupling between the word line and the thyristor.

Figure 13:
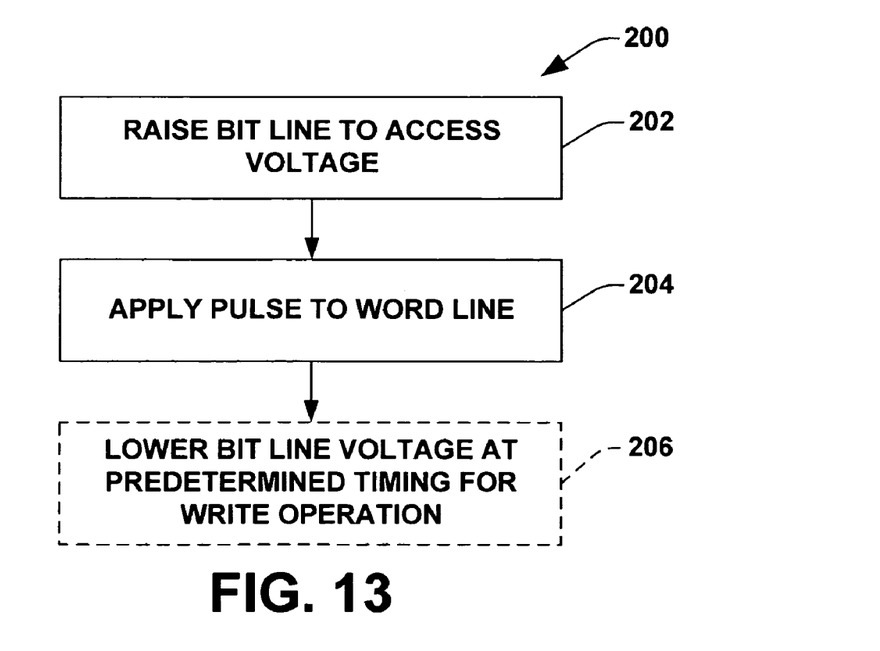
FIG. 13 is a flow chart illustrating a method of accessing a memory device such as the device architecture of FIG. 3 or 6, according to an embodiment of the invention.

In accordance with another embodiment of the invention, a method for accessing a unipolar memory device is provided in FIG. 13 at reference numeral 200. While the method 200 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

Initially, the method 200 begins at 202 with a raising of a bit line to an access voltage. In one embodiment, the access of one or more memory elements in an array portion of a memory device comprises a read operation, while in another embodiment the access comprises a write or programming operation. In a read operation, one memory element from one or more bit lines may be accessed. Each respective bit line having an element to be read is raised to a bit line read voltage. In one embodiment the bit line read voltage is less than a breakdown voltage associated with the trigger components 24 employed therein. This prevents conduction of non-selected memory cells along a selected bit line from interfering with the reading of a selected memory cell. Referring to FIG. 6 in one embodiment, once the bit line 52 has been raised to the appropriate access voltage, the method 200 proceeds to 204, wherein a pulse is applied to the respective word line 54 associated with the respective memory cell. As highlighted above, because of the trigger component 24, the word line pulse need not have a duration that is as long as the access time period. Rather, the short pulse activates the trigger component 24, thereby electrically coupling the respective memory element 21 to the respective bit line 52. A current flowing in the bit line 52 is therefore a function of the data state of the respective memory cell 21, and this current is sensed to identify the data state.

In another embodiment of the invention, the access comprises a write or programming operation. In one embodiment where the memory element comprises a phase change memory element, the memory element is SET or RESET based on a magnitude and duration of a current or voltage pulse applied thereto. In one embodiment, the bit line voltage for a SET operation is less than the bit line voltage for a RESET operation. Because the pulse duration can not be controlled by the word line, a timing in which the respective bit line is brought back to a low value to deactivate the trigger component will dictate the duration of the programming current pulse.

Therefore during a SET programming operation, the method 200 comprises raising the respective bit line 52 to a SET voltage (which is lower than a RESET voltage) at 202. Then a pulse is applied to the respective word line 54 at 204, thereby electrically coupling the respective memory element to the raised bit line. Because the pulse duration on the word line will not impact the continued conductance of the trigger element, the bit line voltage is employed to turn off the trigger component 24. Further, the duration of the SET pulse is dictated by the time period between the pulsing of the word line to activate the trigger component and the time when the bit line SET voltage is lowered to turn off the trigger component 24 at 206 of FIG. 13. The SET duration in one embodiment is a longer time period than a RESET operation duration.

In one embodiment the SET and RESET pulse duration are the same where SET and RESET operation are distinguished by applied power.

In one embodiment the SET operation is initiated with a large power level applied to the cell to breakdown the memory element followed by a pulse delivering less power to crystallize the memory element.

During a RESET, the bit line is raised to a RESET voltage at 202, that is greater than a SET value in one embodiment. The word line is then pulsed at 204 to activate the trigger component, and then the RESET bit line voltage is lowered at 206 at a time necessary for the RESET current pulse, wherein lowering the bit line voltage deactivates the trigger component. In one embodiment the time period at which the RESET bit line voltage is lowered is less than that for a SET operation, wherein the RESET current pulse is greater in magnitude and shorter in duration than a SET pulse.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device, comprising:
 a memory cell coupled between a word line and a bit line, the memory cell comprising a memory element selectively coupled to the bit line via a trigger element, wherein the trigger element comprises a thyristor coupled to the word line.

2. The memory device of claim 1, wherein the thyristor is configured to couple the memory element to the bit line upon application of a pulse to a gate thereof via the respective word line, wherein a duration of the pulse is less than a duration of an access of the memory cell.

3. The memory device of claim 1, wherein the thyristor is configured to couple the memory element to the bit line upon application of a pulse to a gate thereof via the respective word line, wherein a duration of the pulse is equal to the access of the memory cell.

4. The memory device of claim 1, wherein the thyristor is configured to couple the memory element to the bit line upon application of a pulse to a gate thereof via the respective word line, wherein a duration of the pulse is greater than a duration of an access of the memory cell.

5. The memory device of claim 1, wherein the memory element comprises a resistive switching memory element.

6. The memory device of claim 5, wherein the resistive switching memory element comprises a phase change memory element.

7. A memory cell, comprising:
 a memory element associated with a bit line; and
 a trigger component configured to selectively electrically couple the memory element to the bit line for access thereto, wherein the trigger component comprises a thyristor having a gate coupled to a word line associated with the memory element.

8. The memory cell of claim 7, wherein the thyristor is configured to couple the memory element to the bit line upon application of a pulse to the gate thereof via the word line.

9. The memory device of claim 7, wherein the memory element comprises a resistive switching memory element.

10. The memory device of claim 9, wherein the resistive switching memory element comprises a phase change memory element.

11. A memory device, comprising:
means for selectively electrically coupling a memory element to a bit line, wherein the coupling means is activated upon application of a pulse thereto provided on a word line, and wherein a duration of the pulse is less than a duration of the electrical coupling of the memory element to the bit line.

12. The memory device of claim 11, wherein the coupling means comprises a thyristor having a gate terminal coupled to a word line, and wherein the pulse is applied to the gate terminal via the word line.

13. The memory device of claim 11, wherein the memory element comprises a resistive switched memory element.

14. The memory device of claim 13, wherein the resistive switched memory element comprises a phase change memory element.

15. A memory device, comprising:
an array of memory cells arranged in a plurality of rows and columns comprising word lines and bit lines, respectively, wherein each memory cell is selectively electrically coupled to a respective bit line via a trigger device configured to be activated by a pulse provided on a respective word line, the pulse having a duration that is less than an access duration associated therewith.

16. The memory device of claim 15, wherein the each memory cell comprises a resistive switched memory component, and wherein the trigger device comprises a thyristor.

17. The memory device of claim 16, wherein the thyristor comprises a vertical structure formed on a semiconductor substrate, and wherein the resistive switched memory component is formed over the vertical thyristor.

18. The memory device of claim 17, wherein the respective bit line extends over and electrically couples to the resistive switched memory component, and wherein the respective word line surrounds and electrically couples to a gate terminal portion of the thyristor.

19. The memory device of claim 17, wherein the respective bit line extends over and electrically couples to the resistive switched memory component, and wherein the respective word line laterally abuts and electrically couples to a gate terminal portion of the thyristor.

20. The memory device of claim 17, wherein the thyristor comprises a lateral structure formed in or on a semiconductor substrate.

21. The memory device of claim 20, wherein the respective bit line extends over and electrically couples to the respective switched memory component, and further comprising a conductive vertically extending contact electrically coupling the resistive switched memory component to the thyristor.

22. The memory device of claim 21, wherein the respective word line runs under the respective bit line and over the thyristor, and makes electrical contact to a gate terminal thereof.

23. A method of accessing a memory cell selectively coupled to a bit line via a trigger component that is coupled to a word line, comprising:
raising the bit line to an access voltage; and
applying a pulse to the word line having a pulse duration that is less than a duration of an access of the memory cell.

24. The method of claim 23, wherein the access comprises a read operation, and wherein applying the pulse activates the trigger component, thereby electrically coupling the memory cell to the bit line.

25. The method of claim 24, wherein the trigger component comprises a thyristor, and wherein an activation time period thereof is greater than the pulse duration.

26. The method of claim 24, further comprising lowering the bit line to a deactivation potential, thereby deactivating the trigger component.

27. The method of claim 23, wherein the access comprises a write operation, and wherein applying the pulse activates the trigger component, thereby coupling the memory cell to the bit line.

28. The method of claim 27, wherein the memory cell comprises a phase change memory element, and wherein the write operation comprises a set operation, wherein raising the bit line to the access voltage comprises raising the bit line to a set voltage level for a predetermined time period associated with the set operation.

29. The method of claim 27, wherein the memory cell comprises a phase change memory element, and wherein the write operation comprises a reset operation, wherein raising the bit line to the access voltage comprises raising the bit line to a reset voltage level that is greater than a set voltage level for a predetermined time period associated with the reset operation that is shorter than a time period for a set operation.

30. A trigger memory, comprising a trigger element configured to selectively couple a memory component to a bit line for an activation time period based on an activation pulse supplied thereto via a word line, wherein a duration of the activation pulse is less than the activation time period.

31. The trigger memory of claim 30, wherein the trigger element is further configured to be deactivated by supplying a deactivation signal on the bit line that is less than a predetermined threshold.

* * * * *